United States Patent [19]

Cieloszyk

[11] 4,173,664

[45] Nov. 6, 1979

[54] PARYLENE STABILIZATION

[75] Inventor: Gary S. Cieloszyk, Somerville, N.J.

[73] Assignee: Union Carbide Corporation, New York, N.Y.

[21] Appl. No.: 871,146

[22] Filed: Jan. 20, 1978

[51] Int. Cl.$^2$ .............................................. B05D 3/02
[52] U.S. Cl. ........................... 427/385 R; 427/248 H; 427/385 A
[58] Field of Search ............................... 427/248, 385

[56] References Cited

U.S. PATENT DOCUMENTS

| 3,246,627 | 4/1966 | Loeb et al. | 118/49 |
| 3,301,707 | 1/1967 | Loeb et al. | 428/220 |
| 3,600,216 | 8/1971 | Stewart | 428/417 |

Primary Examiner—Bernard D. Pianalto
Attorney, Agent, or Firm—Saul R. Bresch

[57] ABSTRACT

A process for making an article comprising (a) a solid substrate and (b) a coating on said substrate, said coating comprising parylene admixed with a sterically hindered phenol,
  said process comprising diffusing the hindered phenol into the parylene by bringing the hindered phenol into contact therewith and providing sufficient heat to cause the diffusion,
  and the defined article in the case of those phenols, which are not vaporizable at a temperature of less than about 150° C.

17 Claims, No Drawings

PARYLENE STABILIZATION

FIELD OF THE INVENTION

This invention relates to stabilized parylene compositions and a method for making same.

DESCRIPTION OF THE PRIOR ART

Parylene is a conformal coating used primarily in the electronics industry. It is unique as a coating because of its ability to provide ultra-thin films and conform to substrates of varied geometrical shapes and irregularities. Parylene also has excellent chemical resistance and can be used at relatively high temperatures. Another unusual characteristic of parylene is the method in which the coating is formed.

Parylene is a generic term applied to the family of unsubstituted and substituted poly-p-xylylenes. The polymers can be homopolymers or co-polymers depending on whether they are derived from one particular dimer or a mixture of different dimers. The unsubstituted homopolymer poly-p-xylylene has the structure

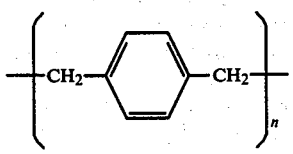

(hereinafter referred to as parylene N) and substituted homopolymers may be illustrated by the following structures:

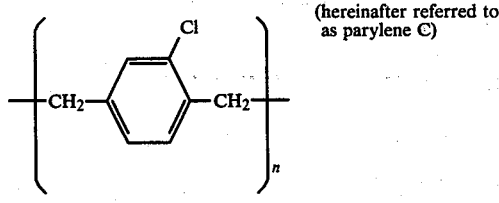

(hereinafter referred to as parylene C)

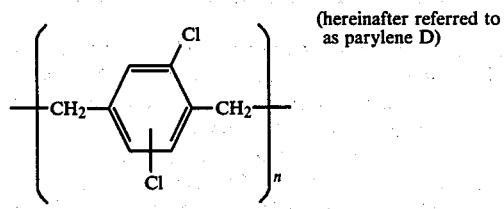

(hereinafter referred to as parylene D)

The substituent can be any organic or inorganic group, which can normally be substituted on aromatic nuclei. Examples of organic substituents are alkyl, aryl, alkenyl, cyano, carboxyl, alkoxy, hydroxy alkyl, and carbalkoxy and examples of inorganic substituents are hydroxyl, nitro, halogen, and amino. Generally, the substituent groups selected are functionally inert under process conditions. Of the substituents, the preferred groups are the lower alkyls having 1 to 10 carbon atoms such as methyl, ethyl, propyl, butyl, and hexyl; the lower aryl hydrocarbons having 1 or 2 benzene rings such as phenyl and napthyl and the alkylated phenyls and naphthyls having 1 to 10 carbon atoms in the alkyl moiety; and the halogens—chlorine, bromine, iodine, and fluorine.

A description of parylene, processes for making it, and the apparatus in which parylene deposition can be effected may be found in U.S. Pat. Nos. 3,246,627; 3,301,707; and 3,600,216, all of which patents are incorporated by reference herein. It will be observed, however, that the term "parylene" is not used in these patents. Instead, the term poly-p-xylylene is used generically and this term is considered to include both the unsubstituted and substituted varieties in the form of homopolymers or copolymers just as the term parylene in this specification.

The articles or parylene compositions of interest here are those in which the parylene is coated on or bonded to a substrate in the physical sense. The substrate may be plastic, metal, or ceramic and, more often than not, is a combination of two or all three. The plastic can be a thermoplastic or thermosetting organic compound, e.g., epoxy, phenol-formaldehyde, or acrylate compounds. The metals are represented by aluminum, iron, steel, and molybdenum; and the ceramics are exemplified by glass and mixtures of various non-metallic and metallic oxides such as silicon oxide, aluminum oxide, titanium oxide, lead oxide, copper oxide, and iron oxide.

The process for coating a substrate with parylene is conventional. Typical steps and conditions of such a process involve first vaporizing a cyclic dimer which contains the desired repeating unit, e.g., cyclic di-p-xylylene, under a vacuum of about 10 to about 100 microns and at a temperature of about 150° C. to about 200° C.; then, pyrolyzing the vaporized cyclic dimer under the same or similar low pressure conditions at about 670° C. to about 690° C. The pyrolysis step breaks the benzylic carbon to carbon bonds to provide the p-xylylene monomer referred to as the p-xylylene diradical or just as the diradical, the diradical remaining in the vapor state; and, finally, introducing the vaporous diradical into the deposition chamber containing the heretofore described substrate, again under the same or similar vacuum, but at ambient temperatures in the range of about 20° C. to about 30° C., where the diradical condenses and polymerizes on all of the exposed surface of the substrate to provide a parylene film thickness of about 0.6 or 0.7 mil. The above described conventional process may be referred to hereinafter as "vacuum pyrolysis".

The function of the parylene coating in the electronics field is to passivate various devices and assemblies. In order to fulfill its function, the coating must retain its integrity, at least to the extent that it can carry out its passivation role over a period of time and under certain environmental constraints. Recognizing temperature as a prime environmental constraint, it is understandable that the electronics industry is concerned with the "thermal endurance" of the parylene coating, i.e., the maximum temperature at which a coating may be expected to serve or perform its intended function for a given time period or the maximum time a coating may be expected to serve at a given temperature.

It has been noted above that one of the unique characteristics of parylene is the temperature at which the coating can be used, but projections of temperatures at which it is expected that electronic devices having a need for parylene coatings will have to be used are constantly rising. At present, some microelectronic applications require thermal endurance in air at temperatures of 125° C. to 150° C. Semiconductor junctions are routinely operated at temperatures above 100° C. and the projected temperatures for power device use are at least 150° C. Still greater miniaturization of many electronic devices requiring passivating coatings also promises higher use temperatures, again, reaching upwards from 150° C. Further, the exposure of these devices to air during use adds to the thermal endurance requirements.

The upshot of the matter is that projected requirements for parylene coatings in electronic applications are that the coatings withstand temperatures of up to about 200° C. in air for periods of time as long as 10 years. Such a thermal endurance has heretofore not been achieved.

SUMMARY OF THE INVENTION

An object of this invention, therefore, is to provide a parylene coated article having a higher level of thermal endurance than has heretofore been achieved and a process for the production of such a parylene composition.

Other objects and advantages will become apparent hereinafter.

According to the present invention, such a process has been discovered for making an article comprising
 (a) a solid substrate; and
 (b) a coating on said substrate, said coating comprising parylene admixed with a sterically hindered phenol, such a process comprising diffusing the hindered phenol into the parylene by bringing the hindered phenol into contact therewith and providing sufficient heat to cause the diffusion.

The article comprises:
 (a) a solid substrate; and
 (b) a coating on said substrate, said coating comprising parylene admixed with a sterically hindered phenol, which is not vaporizable at a temperture of less than about 150° C.

DESCRIPTION OF THE PREFERRED EMBODIMENT

Parylene, the substrate, and the method for coating the substrate with parylene are well-known and have been described above. Various additives to the parylene coating are also conventional such as adhesion promoters, e.g., see U.S. Pat. No. 3,600,216 mentioned above.

Any sterically hindered phenol having at least one functional group, and preferably two or three or more functional groups, can be used in subject process including those which are "vaporizable" at a temperature in the range of about 20° C. to about 150° C. and those hindered phenols which are not vaporizable at such a temperature. The term "vaporizable" means that within the defined temperature range, the hindered phenol will vaporize, but will essentially not degrade or dissociate. It will be understood that hindered phenols, which are vaporizable at temperatures below about 20° C. are excepted as well as those which will degrade or dissociate at diffusion temperatures. The hindered phenols can be liquids or solids, the latter requiring dissolution prior to application. The solids are usually crystalline prior to their being dissolved and take on an amorphous character after the solvent is evaporated, the end result being that the additive adheres to the underlying surface so that diffusion can be accomplished. The hindered phenols may be referred to, generically, as "phenols" or "phenol" in this specification.

The amount of phenol which can be incorporated into the parylene is about 0.1 to about 15 percent by weight based on the weight of the parylene and is preferably about 0.4 percent to about 4 percent. Measurements of these amounts may be made by chlorine determination or oxygen neutron activation described hereinafter. The higher the in-use temperature, the higher the amount of phenol which will, preferably, be incorporated into the parylene. This higher amount will not only enhance the thermal endurance of the parylene, but will compensate for loss through volatilization or other means. Within the above parameters, the amount of phenol which can be incorporated into a parylene film depends on the molecular properties of the parylene and the additive, the diffusion rate, and the time span during which diffusion is carried out. At 210° C., diffusion times are generally in the range of about 15 minutes to about 60 minutes for the specific parylenes and additive mentioned in this specification. While the lower molecular weight phenols diffuse more rapidly, the equilibrium solubility thus being established quickly, the end result, after aging, is a parylene film of lower tensile strength tending to lean towards brittleness rather than having the advantageous higher flexibility characteristic of the phenols of moderate or high molecular weight. The lower molecular weight phenols are considered here to be those having a molecular weight in the range of about 200 to about 275; the moderate molecular weight phenols are those having a molecular weight in the range of about 275 to about 600; and the higher molecular weight phenols are considered to be those in the range of about 600 to about 1200.

It will be understood by those skilled in the art that the thermal endurance of any particular parylene will be enhanced by the addition of the defined phenol; however, among the various parylenes, the thermal endurance of one parylene may outshine that of another parylene, additive or no. It is found, for example, that the relative thermal endurance of the parylenes referred to above is as follows:

| | |
|---|---|
| parylene D + additive | greatest thermal endurance |
| parylene D (without additive) | |
| parylene C + additive | ↓ |
| parylene N + additive | |
| parylene C (without additive) | |
| parylene N (without additive) | least thermal endurance |

Thus, the selection of a particular parylene for a particular application may be made on the basis of other characteristics with the knowledge that the addition of the phenols described herein will enhance its thermal endurance and most probably its tensile strength with which there is some correlation. In this same vein, selection of the substrate may affect performance of the parylenephenol additive combination. For instance, where a copper substrate comes in contact with this combination, the effect on thermal endurance is deleterious. Fortunately, exposed copper, i.e., copper that would come into contact with the parylene coating, is rarely encountered in electronic assemblies.

As noted above, the process comprises diffusing the phenol into the parylene by bringing the phenol into contact with the parylene. Two techniques are suggested for effecting the contact.

The first (referred to as the post-dip technique) comprises contacting an article comprising (a) a solid substrate; and (b) a coating on said substrate, said coating comprising parylene, with the hindered phenol. For this purpose, the phenol will either have to be a liquid itself or in a liquid form such as a solution or suspension. The step of contacting is preferably accomplished by dipping the article into one of the liquid forms, usually a solution, but can be effected by spraying or painting one of the suggested liquids onto the article. In solution, the concentration of phenol additive is about 0.10 percent to about 10 percent by weight of additive based on the weight of the solvent and usually about 2 to about 8 percent. The time of immersion in the solution can be about 3 to about 10 or more seconds. The solvent or suspension medium is then preferably evaporated leaving a substantially uniform coating of solute, i.e., phenol.

To carry out the diffusion, the article is then subjected to a thermal treatment by heating it at a temperature in the range of about 20° C. to about 260° C. and preferably about 100° C. to about 250° C. The heating is preferably accomplished in an inert atmosphere, at least one devoid of oxygen, to avoid any premature oxidation of the parylene film, i.e., oxidation prior to diffusion of the phenol additive into the film. Examples of inert atmospheres are nitrogen and argon. Within the aforementioned range, temperatures are selected which will not affect the substrate. It will also be understood that diffusion temperatures are selected which are below the temperature at which the additive is vaporizable. Temperatures lower than 100° C. are impractical, however, because diffusion is so slow. The heat is supplied for a sufficient length of time to effect diffusion. That diffusion has been effected can readily be determined by the operator using the tests provided below.

After the thermal treatment, the article is permitted to cool, usually at ambient temperatures, and it is then preferably washed with solvent to remove excess additive.

Solvents which may be used both to provide the phenol solution and for removal of excess additive are exemplified by acetone, toluene, benzene, hexane, chloroform, methylene chloride, and methanol.

The solvent is preferably one that will readily evaporate at ambient temperatures leaving a substantially uniform coating of additive on the parylene film.

The second method (referred to as the pre-dip technique) is accomplished by dipping the substrate, prior to its being coated with parylene, into a solution of the defined phenol, allowing the solvent to evaporate, and then depositing parylene on the coated substrate by the conventional vacuum pyrolysis described above; the last step being that of introducing the diradical vapor into a deposition zone containing the coated substrate. The zone is under vacuum and at a temperature at which the vapor condenses on the substrate. The diradical polymerizes to parylene, coating the substrate and forming the article. There is no opportunity here for removing excess phenol additive. The same thermal treatment is used for the pre-dip technique as for the post-dip technique; the phenol can be a liquid per se, or a liquid or solid in a solution or a solid in suspension; pre-dip can be accomplished by dipping, spraying, or painting; solutions are preferred and solution concentrations are in the same range as for post-dip; and immersion times are the same as in post-dip as well as the solvents mentioned therefor.

Simply, the only real procedural difference between post-dip and pre-dip is the mode of initial additive contact. There are advantges and disadvantages so far as results are concerned, however. In the post-dip technique, additive is lost through direct volatilization from the surface of the parylene-coated article; however, if the additive selected is one having high solubility in the parylene film and low volatility, then, high thermal endurance is achieved, the post-dip technique notwithstanding. In the pre-dip technique, on the other hand, loss of the additive through the parylene film is negligible, thus high thermal endurance can be achieved with minimal additive selection requirements. The disadvantage of the pre-dip technique, however, is that the additive coating on the substrate interferes with the adhesion of the parylene to the substrate. Since adhesion is not a problem with the post-dip technique and the amount of additive diffused into the parylene film can be controlled by additive selection and procedural optimization, the post-dip technique is preferred. In any case, it should be noted that the additive cannot be introduced into the parylene film beyond its solubility limit at the temperature of thermal treatment. The phenol additive "ratio" for 5 weight percent additive solutions is typically in the range of about 7 to about 10, the ratio being defined as (i) the mass per unit area of additive on the surface of the parylene after the solvent evaporates divided by (ii) the mass per unit area of parylene film. This ratio is meaningful because, at least in the pre-dip technique, the larger the value the greater the stabilization effect.

To determine the concentration of the phenol in the parylene, the chlorine determination technique and the neutron activation technique can be used. In the chlorine determination technique, sample parylene films (having a halogen substituent) along with control films are analyzed for percent halogen (by weight) based on the weight of the parylene. The difference between the percent halogen in the control and the percent halogen in the sample will be the percent phenol in the film. In the neutron activation technique oxygen in the film is bombarded by thermal neutrons and gives rise to a radioactive species of the same atomic number but one mass unit greater. By comparing the measured decay of a control film and subtracting from the sample film, a measure of oxygen concentration can be determined, which can be related to the phenol concentration. This latter technique appears to be superior to chlorine determination since there is no problem with impurity incorporation and a direct measurement of oxygen is used instead of subtracting large numbers.

The apparatus for dipping, spraying, or painting and for thermal treatment thereafter is conventional as is the apparatus for parylene deposition, typical apparatus for the latter being described above.

Examples of sterically hindered phenols useful in the process are 2, 6 dimethyl phenol; 2, 6 di-tert-butyl-4-methyl phenol; 2, 6-di-tert-butyl-4-butyl phenol; 1, 1, 3-tris(2-methyl-4-hydroxy-5-tert-butyl-phenyl) butane; tetrakis(methylene 3, 5-di-tert-butyl-4-hydroxy hydrocinnamate) methane; 4, 4'-thiobis(6-tert-butyl-3-methyl) phenol; thio bis(ethyl-3-(3'5'-di-tert-butyl-4' hydroxyphenyl)propionate) (hereinafter may be referred to as phenol additive B); and the following:

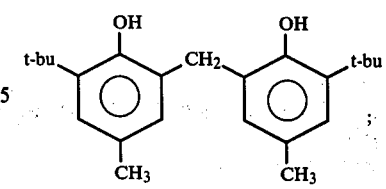

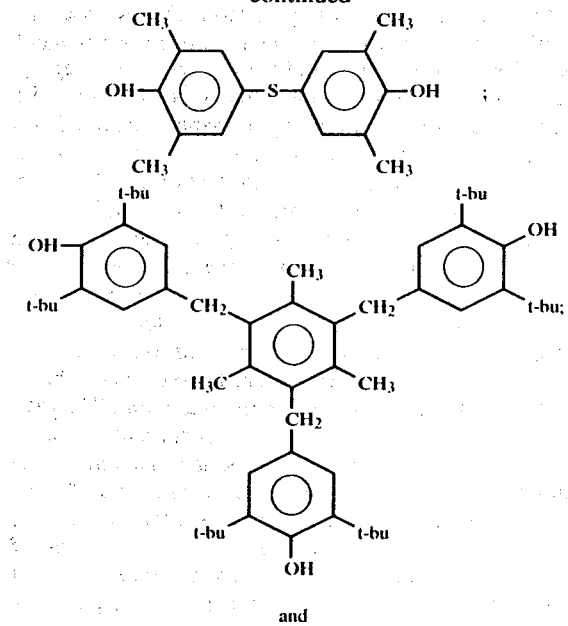

and

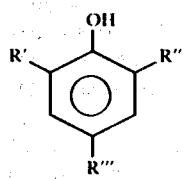

(hereinafter may be referred to as phenol additive A)

Other sterically hindered phenols useful in the process may be represented by the following general structures:

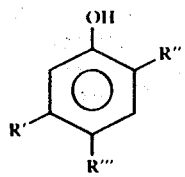

wherein:

R' and R" are alike or different and are alkyl radicals having 1 to 5 carbon atoms. These radicals are preferably the same.

R''' is hydrogen or an alkyl radical having 1 to 5 carbon atoms;

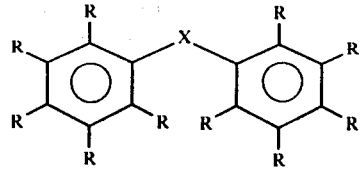

wherein:

R' and R" are alike or different and are alkyl radicals having 1 to 5 carbon atoms.

R''' is the same as R''' above; and

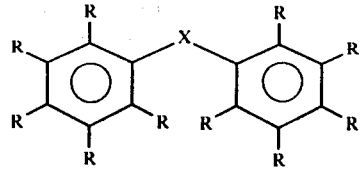

wherein: the R radicals are alike or different and each R can be a hydrogen, methyl, hydroxyl, t-butyl, or an n-butyl radical provided that at least one R is a hydroxyl radical, and X is a sulfur or a methylene radical.

Additional examples of sterically hindered phenol compounds are:

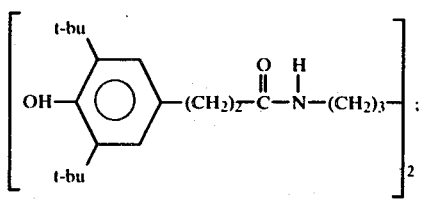

and

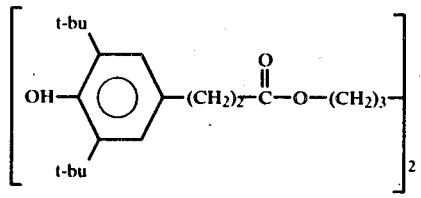

It is found that, among the phenol-parylene combinations tested, phenol additive B is preferred for hybrid (high temperature) applications, and for circuit board applications (where lower diffusion temperatures are necessary), both phenol additive B and phenol additive A are preferred. The post-dip technique is effective for both because of their low volatility and high solubility in parylene. It is also found that, on average, the 10 year use temperature in air for the parylene N or C/phenol additive combination is increased about 40° C. and for the parylene D/phenol additive combination, about 6° C.

The invention is illustrated by the following examples:

EXAMPLE 1

Polymeric films of parylenes N, C, and D are prepared by the vacuum pyrolysis of the appropriate cyclic di-p-xylylene as described above. Films are about 0.6 mil thick and are deposited on glass substrates. The glass substrates are not treated for adhesion so that films can be easily removed for evaluation of their mechanical properties.

The parylene N, C, and D coated glass substrates are then dipped into a 5 weight percent additive/acetone solution. The additive is thio bis(ethyl-3-(3'5'-di-tert-butyl-4'hydroxyphenyl)propionate). After the acetone evaporates, a uniform coating of additive remains on the parylene N, C, and D films. These coated substrates are placed into a 210° C. argon filled oven for 30 minutes. Argon is used to eliminate any premature oxidation of the films before the additive has had time to diffuse into the films (since the diffusion rate of oxygen is much greater than the diffusion rate of the stabilizer into the parylene film). After the coated substrates cool, they are repeatedly dipped into an essentially pure acetone bath to remove any excess additive remaining on the surface of the films. At this point, the outward appearance of the stabilized parylene film is identical to an unstabilized parylene film.

The parylene N, C, and D coated glass substrates are then aged in a circulating air oven at temperatures from 125° C. to 200° C.±1° C. The mechanical properties of the oven aged films are measured as a function of aging time with an Instron mechanical tester after removal from substrates. Specimens are typically 1 inch×0.25 inch×0.5 to 1 mil. Stress-strain curves are obtained at 0.2 inch per minute. A 50 percent reduction in the tensile strength is defined as the failure criteria for oven aged parylene N, C, and D films.

One specimen of parylene N with additive; two specimens of parylene C with additive; and two specimens of parylene D with additive are provided by the above procedure.

The same procedure is carried out (exclusive of the steps concerning the additive) to provide two specimens of parylene N without additive; three specimens of parylene C without additive; and two specimens of parylene D without additive.

The failure times (in hours) for the parylene N, C, and D films with and without additives are as follows:

| Aging Temperature (°C.) | parylene | | | | | |
|---|---|---|---|---|---|---|
| | N | | C | | D | |
| | Additive | Without Additive | Additive | Without Additive | Additive | Without Additive |
| 125 | -- | 24 | | | | |
| 150 | 47 | 2.5 | | 24 | -- | -- |
| 175 | | | 120 | 4 | 180 | 140 |
| 200 | | | 13 | 0.5 | 26 | 13 |

EXAMPLE 2

Four specimens of parylene C, two with additive and two without additive, are prepared as in Example 1. The specimens are removed from their glass substrates.

Differential Scanning Calorimetry (DSC) in both constant temperature (isothermal) and constant time (dynamic) modes are used to evaluate the enhancement in thermal endurance of the parylene with additive against the parylene without additive control. Measurements are made using a Dupont 990 Thermal Analyzer.

(a) In dynamic DSC analysis, two parylene specimens (one with additive and one without, each weighing about 0.50 milligram) are heated at 20° C. per minute in air having a flowrate of 100 cubic centimeters per minute in an aluminum pan. Aluminum screens placed on top of the films ensure good mechanical control of the specimens in the pan. The temperature at which rapid specimen oxidation occurred relative to an empty reference pan is defined as $T_s$(°C.) and is one measure of the thermal endurance of the parylene.

(b) In isothermal DSC analysis, two parylene specimens (one with additive and one without, as in (a) above) are heated at 160° C. per minute to 250° C. under a nitrogen atmosphere. After waiting for 7 minutes for thermal equilibrium, the atmosphere is changed to air. As in (a) above, the specimens are placed in an aluminum pan with aluminum screens on top of the specimens. The time beginning when the air is turned on until the specimens begin to oxidize (an exothermic response relative to an empty reference pan) is defined as the induction period and is another measure of the thermal endurance of parylene films.

The results are as follows:

| | parylene with additive | parylene without additive |
|---|---|---|
| $T_s$ (°C.) | 285 to 290 | 225 to 230 |
| Induction Period at 250° C. (minutes) | 11.0 | 1.0 |

EXAMPLE 3

Using the same procedure as in Example 1, parylene C specimens, three with additive and two without, are prepared. In this example, however, the specimens are maintained on the substrate and the substrate for each specimen is alumina over metal which is treated for adhesion prior to coating. The parylene is placed on the substrate in a comb pattern with 31 teeth and a 5.0 mil spacing between teeth (length to spacing ratio of about 2000). Each substrate is 2 inches by 2 inches, alumina on top followed by a gold overcoat, then copper, then a chromium lower layer of about 200 Angstroms.

The insulation resistance of the comb pattern of each specimen is measured at 100 volts with a megohm resistance bridge after the specimens are removed from the aging oven, equilibrated to room temperature, and then immersed in tap water for 15 minutes.

If the parylene C film is in good condition, the comb pattern will retain a high insulation resistance value (about $10^{12}$ ohm). However, once the parylene C film begins to degrade, water will fill the cracks in the film and the insulation resistance value falls to $10^6$ ohms or less. The $10^6$ ohms is defined as the failure point.

It is found that the insulation resistance of each specimen will drop to $10^6$ ohms or less after being aged at a particular temperature for a particular length of time and that the parylene with additive will retain its insulation resistance for a much longer period of time than the parylene without additive. The results are as follows:

| | Hours in Aging Oven | |
|---|---|---|
| Aging Temperature (°C.) | Parylene with Additive | Parylene without Additive |
| 200 | 6.0 | |
| 175 | 34.0 | 5.0 |
| 142 | 400.0 | 80.0 |

EXAMPLE 4

This example is a simulation of the pre-dip technique.

The procedure used in example 2 is followed except that all of the specimens of which there are 8 are initially prepared without additive (2 specimens of parylene N, 4 specimens of parylene C, and 2 specimens of parylene D).

One of each of the specimens of parylene N, C, and D are placed in an aluminum pan which has been previously uniformly coated on the bottom with two drops of an additive solution comprising 0.53 weight percent N, N'-bis-(beta 3, 5-di-tert-butyl-4-hydroxy phenyl-propionylhydrazine) in acetone. After the solvent evaporates, the additive weighs about 0.0002 gram. Using aluminum screens, good contact is obtained between the films and the coated pan. The additive is diffused into the parylene film under the conditions for carrying out the DSC measurements in (b) of Example 2 by heating to 250° C. Similar specimens are treated in the same manner in an uncoated aluminum pan.

The above is repeated for two parylene specimens following the procedure of (a) of Example 2 with one specimen in a coated pan and the other in an uncoated pan.

The results are as follows:

| parylene | $T_S$ (°C.) with additive | $T_S$ (°C.) without additive | Induction Period at 250° C. (minutes) with additive | Induction Period at 250° C. (minutes) without additive |
|---|---|---|---|---|
| N | 275 to 280 | 215 to 220 | | |
| C | 280 to 285 | 225 to 230 | 39.0 | 1.0 |
| D | 310 to 315 | 280 to 285 | | |

I claim:
1. A process for making an article comprising (a) a solid substrate and (b) a coating on said substrate, said coating comprising parylene admixed with a sterically hindered phenol wherein the amount of hindered phenol is about 0.1 to about 15 percent by weight based on the weight of the parylene,
said process comprising diffusing the hindered phenol into the parylene by bringing the hindered phenol into contact with the parylene and providing sufficient heat to cause the diffusion.

2. The process defined in claim 1 wherein the molecular weight of the hindered phenol is in the range of about 275 to about 1200.

3. The process defined in claim 2 wherein the parylene is poly-p-xylylene, poly-chloro-p-xylylene, or poly-dichloro-p-xylylene.

4. The process defined in claim 3 wherein the parylene is poly-chloro-p-xylylene.

5. The process defined in claim 1 wherein the solid substrate is first coated with parylene and then the coated substrate is contacted with the hindered phenol.

6. The process defined in claim 5 wherein the hindered phenol is admixed with a solvent prior to contact with the substrate.

7. The process defined in claim 5 wherein the solvent is evaporated after contact and prior to diffusion.

8. The process defined in claim 7 wherein the temperature of the diffusion step is in the range of about 100° C. to about 250° C.

9. The process defined in claim 8 wherein the molecular weight of the hindered phenol is in the range of about 275 to about 1200.

10. The process defined in claim 9 wherein the parylene is poly-p-xylylene, poly-chloro-p-xylylene, or poly-dichloro-p-xylylene.

11. The process defined in claim 10 wherein the parylene is poly-chloro-p-xylylene.

12. The process defined in claim 8 wherein the hindered phenol is

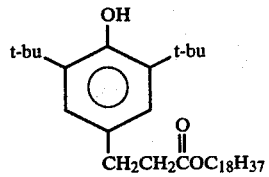

13. The process defined in claim 8 wherein the hindered phenol is thio bis(ethyl-3-(3'5'-di-tert-butyl-4'hydroxyphenyl)propionate).

14. The process defined in claim 1 wherein the solid substrate is first contacted with the hindered phenol and is then coated with parylene.

15. The process defined in claim 14 wherein the hindered phenol is admixed with a solvent prior to contact with the substrate.

16. The process defined in claim 15 wherein the solvent is evaporated after contact and prior to the coating step.

17. The process defined in claim 16 wherein the temperature of the diffusion step is in the range of about 100° C. to about 250° C.

* * * * *